(12) United States Patent
Linck

(10) Patent No.: US 11,356,090 B2
(45) Date of Patent: Jun. 7, 2022

(54) ELECTRONIC CURRENT-SWITCHING SYSTEM PROVIDED WITH A REDUNDANT CONTROL SOLUTION

(71) Applicant: SAFRAN ELECTRICAL & POWER, Blagnac (FR)

(72) Inventor: Benoît Linck, Blagnac (FR)

(73) Assignee: SAFRAN ELECTRICAL & POWER, Blagnac (FR)

(*) Notice: Subject to any disclaimer, the term of this patent is extended or adjusted under 35 U.S.C. 154(b) by 0 days.

(21) Appl. No.: 17/312,124

(22) PCT Filed: Nov. 29, 2019

(86) PCT No.: PCT/FR2019/052868
§ 371 (c)(1),
(2) Date: Jun. 9, 2021

(87) PCT Pub. No.: WO2020/120866
PCT Pub. Date: Jun. 18, 2020

(65) Prior Publication Data
US 2022/0038096 A1 Feb. 3, 2022

(30) Foreign Application Priority Data
Dec. 11, 2018 (FR) ...................................... 1872692

(51) Int. Cl.
*H03K 3/00* (2006.01)
*H03K 17/00* (2006.01)
(Continued)

(52) U.S. Cl.
CPC ........... *H03K 17/687* (2013.01); *H03K 3/017* (2013.01)

(58) Field of Classification Search
None
See application file for complete search history.

(56) References Cited

U.S. PATENT DOCUMENTS

2002/0159276 A1* 10/2002 Deboy ............... H03K 17/0822
363/20
2006/0200688 A1 9/2006 Tofigh et al.
2020/0044650 A1* 2/2020 Fujita ..................... H01H 9/548

FOREIGN PATENT DOCUMENTS

EP 1928090 A2 6/2008
EP 3001535 A1 3/2016
EP 1479147 B1 7/2019

OTHER PUBLICATIONS

French Search Report in FR Application No. 1872692, dated Sep. 12, 2019, (3 pages).
(Continued)

*Primary Examiner* — Kenneth B Wells
(74) *Attorney, Agent, or Firm* — Bookoff McAndrews, PLLC

(57) ABSTRACT

An electronic current-switching system comprising a driver unit and a current-switching device with one controlled transistor, a control unit coupled to said transistor, a power supply unit of the control unit and a digital communication bus transmitting to the control unit a first control signal of the driver unit. The power supply unit comprises: a transformer, an integrated circuit including a clock input coupled to a second output of the driver unit delivering a second control signal having the form of a pulsed signal with an adjustable duty cycle, and an output delivering to the transformer a primary voltage signal dependent on the second control signal, and a voltage divider bridge measuring the frequency-domain signal delivered by the transformer.

7 Claims, 2 Drawing Sheets

(51) Int. Cl.
  *H03K 17/687* (2006.01)
  *H03K 19/003* (2006.01)
  *H03K 3/017* (2006.01)

(56) References Cited

OTHER PUBLICATIONS

International Search Report issued in International Application No. PCT/FR2019/052868, dated Jun. 8, 2020 (3 pages).

* cited by examiner

ELECTRONIC CURRENT-SWITCHING SYSTEM PROVIDED WITH A REDUNDANT CONTROL SOLUTION

CROSS-REFERENCE TO RELATED APPLICATION(S)

This application is the U.S. national phase entry under 35 U.S.C. § 371 of International Application No. PCT/FR2019/052868, filed on Nov. 29, 2019, which claims priority to French Patent Application No. 1872692, filed on Dec. 11, 2018.

TECHNICAL FIELD

The invention relates to an item of electrical protection equipment, and more particularly to an electronic circuit breaker for switching current intended to be installed on an electrical circuit of an aircraft.

PRIOR ART

A static electronic circuit breaker is an electronic circuit breaker which can be driven by a microcontroller known as a Solid State Power Controller (SSPC). This type of circuit breaker has the function of protecting wires but also of switching loads remotely. Owing to its electronic features, it can also include many additional functions such as actuation based on control logic, detection of electric arcs, current measurement, transmission of information to the crew or to the maintenance system. SSPCs may be configured for AC or DC currents of low and medium power.

The electronic circuit breaker is said to be static in that it does not contain any moving parts of the kind found in electromechanical circuit breakers.

An electronic circuit breaker such as a SSPC is parameterizable to be able to adapt to different configurations of wiring in an aircraft. The parameters generally include information of "current protection rating", "default state", "lock-out" etc.

These electronic circuit breakers are generally composed of two controlled MOSFET transistors installed in high side & low side configuration in the case of an AC SSPC, or else a single controlled MOSFET transistor in the case of a DC SSPC for the power switch part, and an electronic control unit to command and monitor variations in the current through the wire in accordance with the received configuration parameters. Several protection functions ($I^2t$, Thermal memory Function) may be generated in parallel by the microcontroller via the acquisition of the current passing through the SSPC which can be done by way of a measurement shunt or any other current-measuring device.

FIG. 1 schematically represents a single-phase AC SSPC static circuit breaker of the prior art.

The AC SSPC static circuit-breaker 1 comprises two MOSFET transistors 2 installed in high side & low side configuration in series between an input terminal 3 and an output terminal 4, a means 5 for measuring the current passing through the two controlled transistors 2 and installed between the two controlled transistors 2, and an electronic control unit 6 powered by a power supply unit 7 and coupled to a communication unit 8 which is connected to a communication bus 9.

When a current fault is detected, the electronic control unit sends an OFF control order to the MOSFET power transistor gates.

The electronic control unit 6 of the AC or DC electronic circuit breaker 1 is referenced at the midpoint located at the level of the current-measuring means 5. This electronic control unit is insulated from the outside environment, and therefore an external control member, particularly owing to the power supply unit 7 internal to the static circuit-breaker 1 which is insulated from the outside environment and particularly from the power cable connected to the input terminal 3.

The electronic circuit breaker 1 can also be controlled from an external driver member P coupled to the communication unit 8 via the communication bus 9.

This digital communication bus 9 is not redundant. Consequently, in the event of a simple failure on this bus 9 which can be transversal and shared by several electronic circuit breakers 1, the control function of the circuit breaker 1 is lost. In the absence of any command, the electronic control unit 6 managing the protection functions enters the default state preprogrammed in advance.

This simple solution may be insufficient if, as a function of other higher-level system parameters, it is necessary to switch or re-power the load before replacing the faulty electronics board, particularly before the next maintenance operation.

A simple solution consists in making the communication bus redundant and therefore adding a second digital insulator. This is the most currently used solution. It has the drawback of adding active electronic components and therefore making the control electronics of the electronic circuit breaker less reliable.

Moreover, other applications exist (smart drivers for power inverters) which have studied more complex solutions consisting in integrating a full communications bus with multiplexing and demultiplexing of the information on either side of the transformer providing the galvanic isolation.

SUMMARY OF THE INVENTION

The invention aims to supply a redundant control solution for an electronic circuit breaker without complicating the existing electronics, in order to avoid reducing the reliability of the existing functionality.

In a first subject of the invention, provision is made for an electronic current-switching system comprising an electronic driver unit and an electronic current-switching device including at least one controlled transistor, an electronic control unit coupled to said at least one controlled transistor and to current-measuring means, a power supply unit of the electronic control unit including a transformer, and a communication unit coupled, on the one hand, to a first output of the electronic driver unit via a digital communication bus and, on the other hand, to the electronic control unit to transmit a first control signal from the communications board to the electronic control unit.

According to a general feature of the invention, the power supply unit further comprises:

- an integrated circuit including a clock input coupled to a second output of the driver unit delivering a second control signal having the form of a pulsed signal with an adjustable duty cycle, and an output electrically connected to the primary winding and delivering to the transformer a primary voltage dependent on the control signal, and
- two electrical resistances forming a voltage divider bridge electrically connected at the output of the transformer to measure the frequency-domain signal delivered by the transformer, the measured signal being transmitted to the electronic control unit.

the electronic control unit being configured to control the opening or closing of said at least one controlled transistor as a function of said measured signal if it does not receive the first control signal.

Owing to the second control signal which has the same command as the first control signal, which has a different shape, the power supply unit of the electronic control unit of the electronic current-switching device according to the invention thus makes it possible to maintain control of the SSPC channel, i.e. of the current-switching device, in the event of a failure of the main digital bus, particularly in the event of a fault of the digital insulator (short-circuit, open circuit or drift), for a cumulative malfunction rate of approximately $0.9^{E-06}$ in flight hours (Fides reliability calculation method) with a single-corridor type aircraft flight profile.

The Fides reliability calculation is a known guide used to perform predicted reliability calculations for electronic components and systems. This evaluation is generally expressed in FIT (number of failures for 10^9 hours) or MTBF (mean time between failures). This reliability data is the basis for studies of maintainability (dimensioning of Maintenance in Operational Condition stocks), availability and safety.

Preferably, the electronic current-switching device further comprises current-measuring means, and the transformer includes a primary winding and a secondary winding coupled by induction to the primary winding and delivering a supply voltage to the electronic coupling unit.

Preferably, the driver unit comprises a computing unit configured to formulate a command of the electronic current-switching device, and a first control signal and a second control signal on the basis of said formulated command, the computing unit and the driver unit comprising:

a first output delivering the first control signal to the electronic control unit via the first output of the driver unit, the communication bus and the communication unit, and a second output delivering the second control signal to the electronic control unit via the second output of the driver unit and the power supply unit, the second control signal having the form of a pulsed signal with an adjustable duty cycle.

Advantageously, said at least one controlled transistor can be an insulated-gate field effect transistor (MOSFET).

The electronic control unit can advantageously be a microcontroller.

Preferably, the means for measuring the frequency domain signals are configured to take measurements at a frequency between 10 and 100 kHz.

In a second subject of the invention, provision is made for a method for controlling an electronic current-switching system comprising a control unit coupled to an electronic current-switching device, the controlling method comprising:

the sending of a first control signal by a driver unit to a control unit of an electronic control device, the controlling of at least one controlled transistor of the current-switching device by the electronic control unit on the basis of the first control signal received and at least one measurement of the current passing through said at least one controlled transistor, the electronic control unit being powered by a power supply unit comprising a transformer comprising a primary winding and a secondary winding coupled by induction to the first winding and delivering a supply voltage to said electronic control unit.

According to a general feature of the invention, the controlling method further comprises:

the sending of a second control signal by the driver unit, the second control signal having the form of a pulsed signal with an adjustable duty cycle, the reception of said second control signal by a clock input of an integrated circuit of the power supply unit, the sending, by an output of the integrated circuit, of a primary voltage signal to the primary winding of the transformer, the primary voltage signal depending on the second control signal received, the measurement of the frequency-domain signal delivered by the secondary winding of the transformer as a function of the primary voltage signal received, the transmission of the measured signal to the electronic control unit, and the control of the opening or closing of said at least one controlled transistor as a function of said measured signal if the electronic control unit does not receive the first control signal.

Preferably, the controlling method further comprises:

the formulation of a command of the electronic current-switching device, the determination of the first control signal on the basis of said formulated command, the determination of the second control signal on the basis of said formulated command, the transmission of the first control signal to the electronic control unit via the first output of the driver unit, the communication bus and the communication unit, and the transmission of the second control signal to the electronic control unit via the second output of the driver unit and the power supply unit, the second control signal having the form of a pulsed signal with an adjustable duty cycle.

BRIEF DESCRIPTION OF THE DRAWINGS

The invention will be better understood on reading the following description, which is illustrative but non-limiting, with reference to the appended drawing wherein.

DESCRIPTION OF THE EMBODIMENTS

Figure 1:
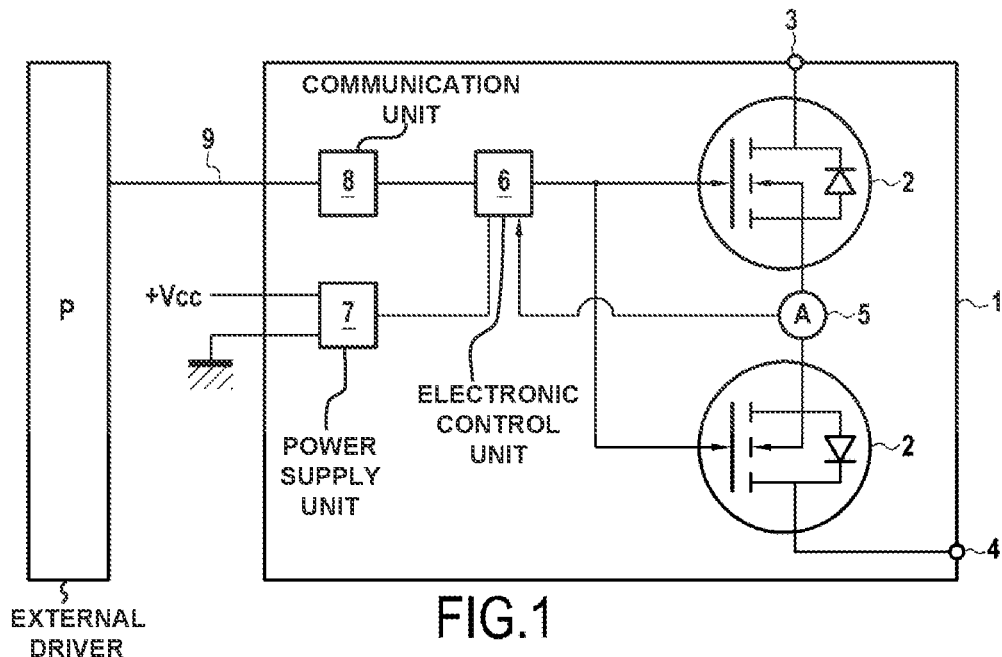
FIG. 1, already described, schematically represents a single-phase AC SSPC static circuit-breaker of the prior art.
Figure 2:
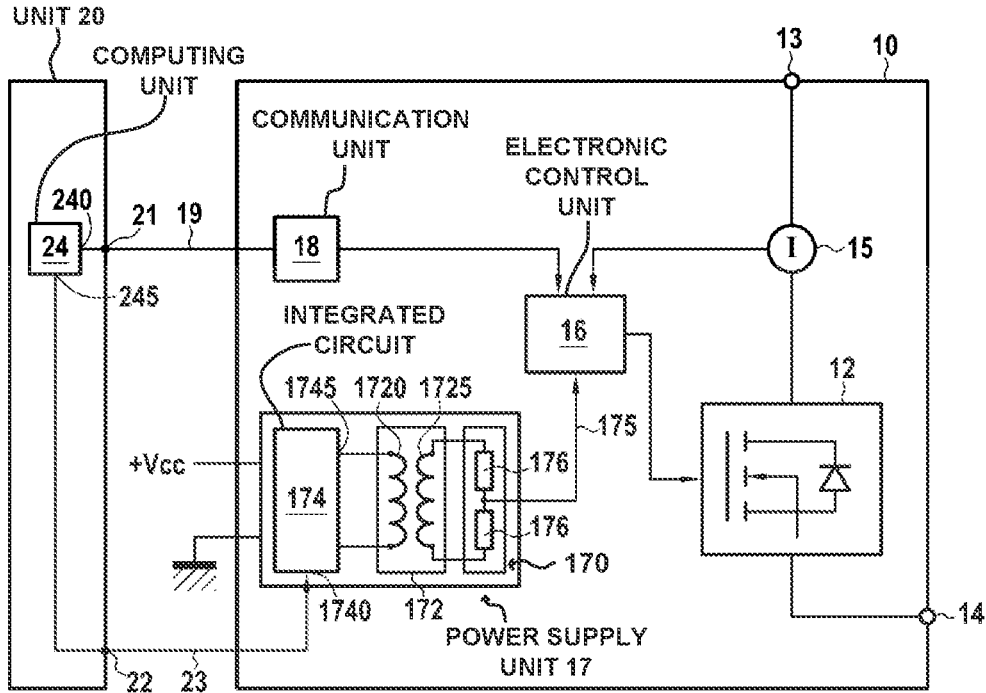
FIG. 2 schematically represents an electronic current-switching system according to an embodiment of the invention.

FIG. 2 schematically represents the electronic current-switching system according to an embodiment of the invention.

The electronic current-switching system comprises an electronic current-switching device 10 and a control board driver unit 20 electrically coupled with the current-switching device 10.

The device 10 comprises a current-switching unit comprising at least one controlled MOSFET transistor 12 connected between an input terminal 13 and an output terminal 14. The input terminal 13 and the output terminal 14 are intended to be connected between two terminals of an electrical circuit, the current of which must be monitored, the two terminals of the electrical circuit being electrically connected together via the electronic current-switching device 10 when the transistor(s) 12 of the current-switching unit are closed.

The device 10 further comprises a means 15 for measuring the current passing through the controlled transistor 12 of the current-switching unit and an electronic control unit 16, which may include a microcontroller, powered by a power supply unit 17 via a supply connection system 170 and coupled to a communication unit 18 which is connected to a communication bus 19.

The measuring means 15 can be a current detector or else a shunt resistance cooperating with an electronic measuring module integrated into the electronic control unit 16 (e.g., an electronic measuring module integrated into a microcontroller).

The driver unit 20 of the electronic current-switching system comprises a computing unit 24 configured to formulate a command of the electronic current-switching device 10. The computing unit 24 comprises a first and second output 240 and 245, the first output 240 of the computing unit 24 being coupled to a first output 21 of the driver unit 20, and the second output 245 of the computing unit 24 being coupled to a second output 22 of the driver unit. The first output 21 of the driver unit 20 is coupled to the communication unit 18 of the device 10 via the communication bus 19 while the second output 22 of the driver unit 20 is coupled to the power supply unit 17 of the electronic control unit 16 via a connection 23.

The computing unit 24 is configured to deliver a first control signal on its first output 240 and a second control signal on its second output 245. The two control signals are formulated on the basis of the command to transport the same control information of the device 10 but in a different form. The first control signal is conveyed using the communication bus 19 which is a digital bus, for example of CAN, SPI, or I2C type. More precisely, the first control signal is a frame containing an item of digital information encoded on several bits. The second control signal has the form of a pulsed signal with an adjustable duty cycle whereas the first signal is different from such a signal.

The power supply unit 17 comprises a transformer 172, an integrated circuit 174, and two resistances 176. The second control signal is delivered to a clock input 1740 of the integrated circuit. The transformer includes a primary winding 1720 and a secondary winding 1725.

The integrated circuit 174, on receiving the clock pulse, then delivers as output a primary voltage signal to the primary winding 1720 depending directly on the pulsed signal received by the clock input 1740 of the integrated circuit, and therefore transporting an item of control information relating to the opening or closing of the controlled transistor 12 of the device 10.

The primary voltage signal is transmitted by induction to the secondary winding 1725 of the transformer which delivers a secondary voltage signal including the frequency-domain signal contained in the primary voltage signal, i.e. the control information of the device 10.

The resistances 176 are installed at the terminals of the secondary winding 1725 and form a voltage divider bridge making it possible to measure the secondary voltage signal delivered by the secondary winding 1725. The measured signal is then transmitted to the electronic control unit 16 via a connection system that includes a connection 175 separate from the power supply connection system 170.

The electronic control unit 16 comprises two inputs. A first input coupled to an output of the communication unit 18 to receive the first control signal, and a second input coupled to the voltage divider bridge formed by the resistances 176 to receive the measured signal representing the second control signal.

The electronic control unit 16 is configured to control the opening or closing of said at least one controlled transistor on the basis of the first control signal when it receives it, and on the basis of the signal measured by the voltage divider bridge and representing the second control signal when it does not receive the first control signal.

Figure 3:
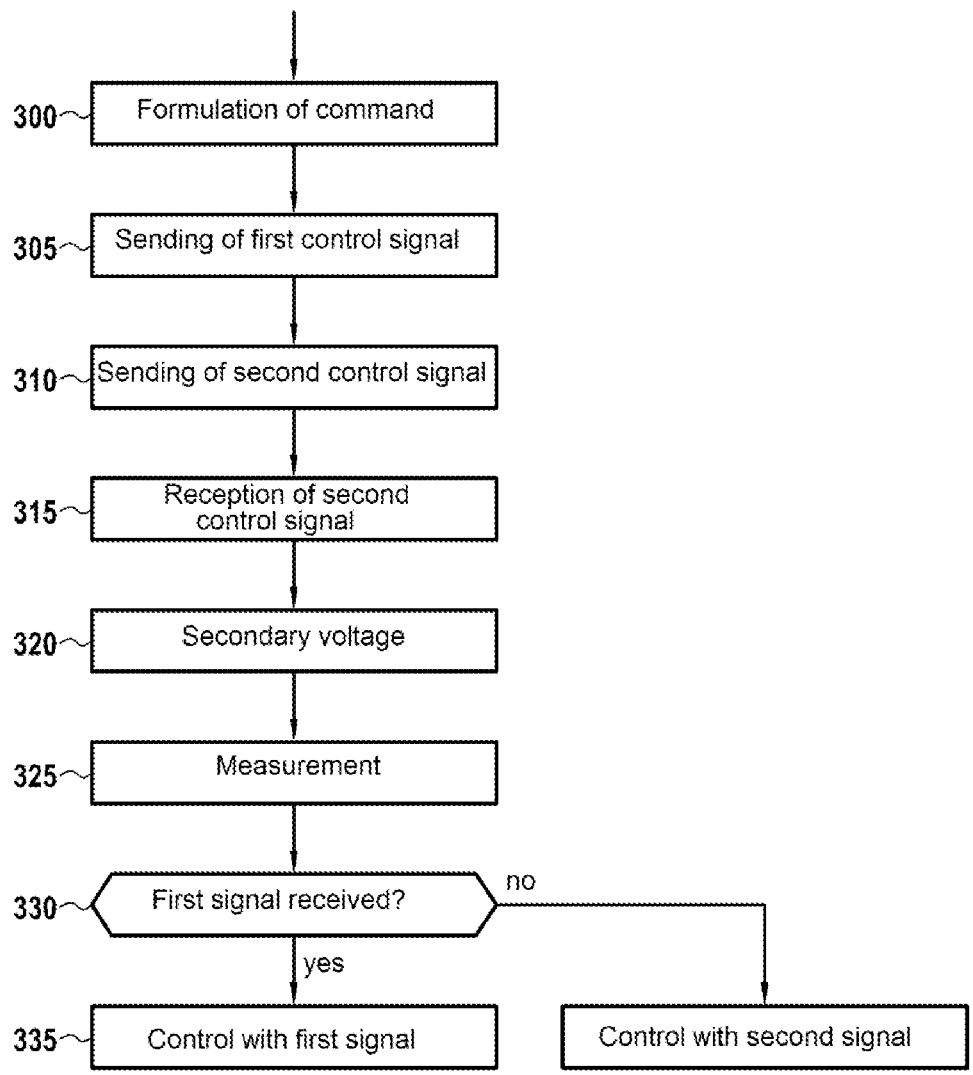
FIG. 3 represents a flowchart of a method for triggering the electronic current-switching system of FIG. 2 according to a method of implementation.

FIG. 3 illustrates a flowchart of a method for controlling the electronic current-switching system of FIG. 2 according to a method of implementation.

In a first step 300, the computing unit 24 formulates a command of the current-switching device 10 and two control signals on the basis of this command, the two control signals having different forms.

In a following step 305, the computing unit 24 of the driver unit 20 delivers, on its first output 240, the first control signal to the electronic control unit 16 of the device 10 via the first output 21 of the driver unit 20, the communication bus 19 and the communication unit 18.

In a following step 310, the computing unit 24 of the driver unit 20 delivers, on its second output 245, the second control signal to the power supply unit 17 of the electronic control unit 16 of the device 10 via the second output 22 of the driver unit 20 and a connection system that includes a connection 23. The second control signal has the form of a pulsed signal with an adjustable duty cycle.

In a following step 315, the clock input 1740 of the integrated circuit 174 of the power supply unit 17 receives the second control signal and the output 1745 of the integrated circuit 174 delivers, in response, a primary voltage signal to the primary winding 1720 depending directly on the second control signal.

In a following step 320, the secondary winding 1725 of the transformer 172 delivers a secondary voltage signal in response to the transmission by induction of the primary voltage signal by the primary winding 1720.

The secondary voltage signal passes through the resistances 176 of the voltage divider bridge which, in a following step 325, delivers to the electronic control unit 16 a measuring signal relative to the secondary voltage signal dependent on the second control signal received by the power supply unit 17.

In a step 330 the electronic control unit 16 checks whether or not it has received the first control signal.

If the first control signal has been received by the electronic control unit 16, the latter controls in a step 335 the opening or closing of the controlled transistor 12 as a function of the first control signal.

If the first control signal has not been received by the electronic control unit 16 when it receives the second control signal delivered by the power supply unit 17, in a step 340 it controls the opening and closing of the controlled transistor 12 as a function of the measured signal delivered by the voltage divider bridge of the power supply unit 17.

The invention thus supplies a redundant control solution for an electronic circuit breaker without complicating the existing electronics, in order to avoid reducing the reliability of the existing functionality.

The invention claimed is:

1. An electronic current-switching system comprising an electronic driver unit and an electronic current-switching device including at least one controlled transistor, an electronic control unit coupled to said at least one controlled transistor, a power supply unit of the electronic control unit including a transformer, and a communication unit coupled, on the one hand, to a first output of the driver unit via a digital communication bus and, on the other hand, to the electronic control unit to transmit a first control signal, wherein the power supply unit further comprises:

an integrated circuit including a clock input coupled to a second output of the driver unit delivering a second control signal having the form of a pulsed signal with an adjustable duty cycle, and an output delivering to the transformer a primary voltage signal dependent on the control signal, and a voltage divider bridge electrically connected at the output of the transformer to measure the frequency-domain signal delivered by the transformer, said measured signal being transmitted to the electronic control unit which is configured to control the opening or closing of said at least one controlled transistor as a function of said measured signal if it does not receive the first control signal.

2. The electronic current-switching system as claimed in claim 1, wherein the driver unit comprises a computing unit configured to formulate a command of the electronic current-switching device, and a first control signal and a second control signal on the basis of said formulated command, the computing unit of the driver unit comprising:

a first output delivering the first control signal to the electronic control unit, via the first output, the communication bus and the communication unit, and a second output delivering the second control signal to the electronic control unit via the second output of the driver unit and the power supply unit, the second control signal having the form of a pulsed signal with an adjustable duty cycle.

3. The electronic current-switching system as claimed in claim 1, wherein said at least one controlled transistor of the electronic current-switching device is an insulated-gate field effect transistor.

4. The electronic current-switching system as claimed in claim 1 wherein the electronic control unit of the electronic current-switching device is a microcontroller.

5. The electronic current-switching system as claimed in claim 1, wherein the electronic current-switching device includes current-measuring means configured to take measurements at a frequency between 10 and 100 kHz.

6. A method for controlling an electronic current-switching system comprising a driver unit coupled to an electronic current-switching device, the controlling method comprising:

the sending of a first control signal by a driver unit to an electronic control unit of the electronic current-switching device, the controlling of at least one controlled transistor of the current-switching device by the electronic control unit on the basis of the first control signal received and at least one measurement of the current passing through said at least one controlled transistor, the electronic control unit being powered by a power supply unit comprising a transformer comprising a primary winding and a secondary winding coupled by induction to the first winding and delivering a supply voltage to said electronic control unit, wherein the controlling method further comprises:

the sending of a second control signal by the driver unit, the second control signal having the form of a pulsed signal with an adjustable duty cycle, the reception of said second control signal by a clock input of an integrated circuit of the power supply unit, the sending, by an output of the integrated circuit, of a primary voltage signal to the primary winding of the transformer, the primary voltage signal depending on the second control signal received, the measurement of the frequency-domain signal delivered by the secondary winding of the transformer in response to the primary voltage signal received, the transmission of the measured signal to the electronic control unit, and the control of the opening or closing of said at least one controlled transistor as a function of said measured signal if the electronic control unit does not receive the first control signal.

7. The method for controlling an electronic current-switching system as claimed in claim 6, further comprising:

the formulation of a command of the electronic current-switching device, the determination of the first control signal on the basis of said formulated command, the determination of the second control signal on the basis of said formulated command, the transmission of the first control signal to the electronic control unit via the first output of the driver unit, the communication bus and the communication unit, and the transmission of the second control signal to the electronic control unit via the second output of the driver unit and the power supply unit, the second control signal having the form of a pulsed signal with an adjustable duty cycle.

* * * * *